United States Patent [19]

Christopher

[11] Patent Number: 4,783,756

[45] Date of Patent: Nov. 8, 1988

[54] SAMPLED DATA TONE CONTROL SYSTEM

[75] Inventor: Todd J. Christopher, Indianapolis, Ind.

[73] Assignee: RCA Licensing Corporation, Princeton, N.J.

[21] Appl. No.: 911,156

[22] Filed: Sep. 24, 1986

[51] Int. Cl.$^4$ ............................................... G06F 7/38
[52] U.S. Cl. ........................... 364/715.01; 364/724.01
[58] Field of Search ............. 364/715, 724; 333/28 R, 333/18, 166, 28 T

[56] References Cited

U.S. PATENT DOCUMENTS

| | | | |
|---|---|---|---|
| 3,889,108 | 6/1975 | Cantrell | 364/724 |
| 4,242,650 | 12/1980 | Cordell | 333/28 R |
| 4,615,038 | 9/1986 | Lim et al. | 375/14 |

OTHER PUBLICATIONS

Ishigaki et al., "Monolithic Filter and Its Application to TV MPX Sound Decoder IC", IEEE Trans. CE, vol. CE-29, No. 4, 9/83, pp. 475–485.

Hood, "Modular Preamplifier", Wireless World, Nov. 1982, pp. 60–64.

Digit 2000 VLSI Digital TV System, "APU 2400 Audio Processor Unit", pp. 95–110, Edition 1985/6, ITT Intermetal, Freiburg, W. Ger.

Hirata, "Simple Digital Filters for Sound Reproduction", Wireless World, Sep., 1982, pp. 77–79.

Graeme, "Applications of Operational Amplifiers", pp. 214–215, 1973, McGraw-Hill Book Co., N.Y.

Self, "Precision Preamplifier", Wireless World, Oct., 1983, pp. 31–34.

Primary Examiner—Gary V. Harkcom
Assistant Examiner—Tan V. Mai
Attorney, Agent, or Firm—Eugene M. Whitacre; Paul J. Rasmussen; Eric P. Herrmann

[57] ABSTRACT

A sampled data treble control system, requiring a single multiplier element, includes the cascade connection of a first adder, the multiplier, and a second adder coupled between the system input and output terminals. A subtracter develops the differences between the system input and output signals and applies them to an Infinite Impulse Response filter. The filtered differences are scaled and coupled to the first and second adders. The system transfer function H(Z) is given by $$H(Z) = [1 + (Z+1)/(1+1/A)K]/1 + (Z-1)/(1+A)K]$$

wherein A is a treble control variable applied to the multiplier, K is a scaling constant and Z is the conventional Z-transform variable.

15 Claims, 4 Drawing Sheets

SAMPLED DATA TONE CONTROL SYSTEM

This invention relates to treble control circuitry for use with sampled data audio signals.

BACKGROUND OF THE INVENTION

A digital sampled data treble control circuit has been described by Yoshimutsu Hirata in Wireless World, September 1982, pp. 77-79. This treble control circuit includes the cascade connection of a variable finite impulse response filter, a multiplier, a variable infinite impulse response filter and a second multiplier. Each of the two filters includes an additional multiplier element, thus, the cascade connection of filters and multipliers in the treble control includes a total of four multipliers.

Digital multipliers tend to be relatively complex and expensive circuit elements. Analog multipliers tend to be temperature and power supply sensitive and, thus, require significant compensation circuitry to ensure stability. Thus, for either digital or analog sampled data treble control circuitry it is desirable to minimize the number of required multipliers.

SUMMARY OF THE INVENTION

The present invention is a sampled data tone control system, for providing treble boost and treble cut, which includes a multiplier circuit. The tone control includes the cascade coupling of an input terminal, a first signal summing circuit, the multiplier circuit, a second signal summing circuit and the system output terminal. Input signals are subtractively combined with signal from the output of the second summing circuit and filtered. The filtered difference signal is coupled to respective input terminals of the first and second summing circuits.

DETAILED DESCRIPTION

Figure 1:
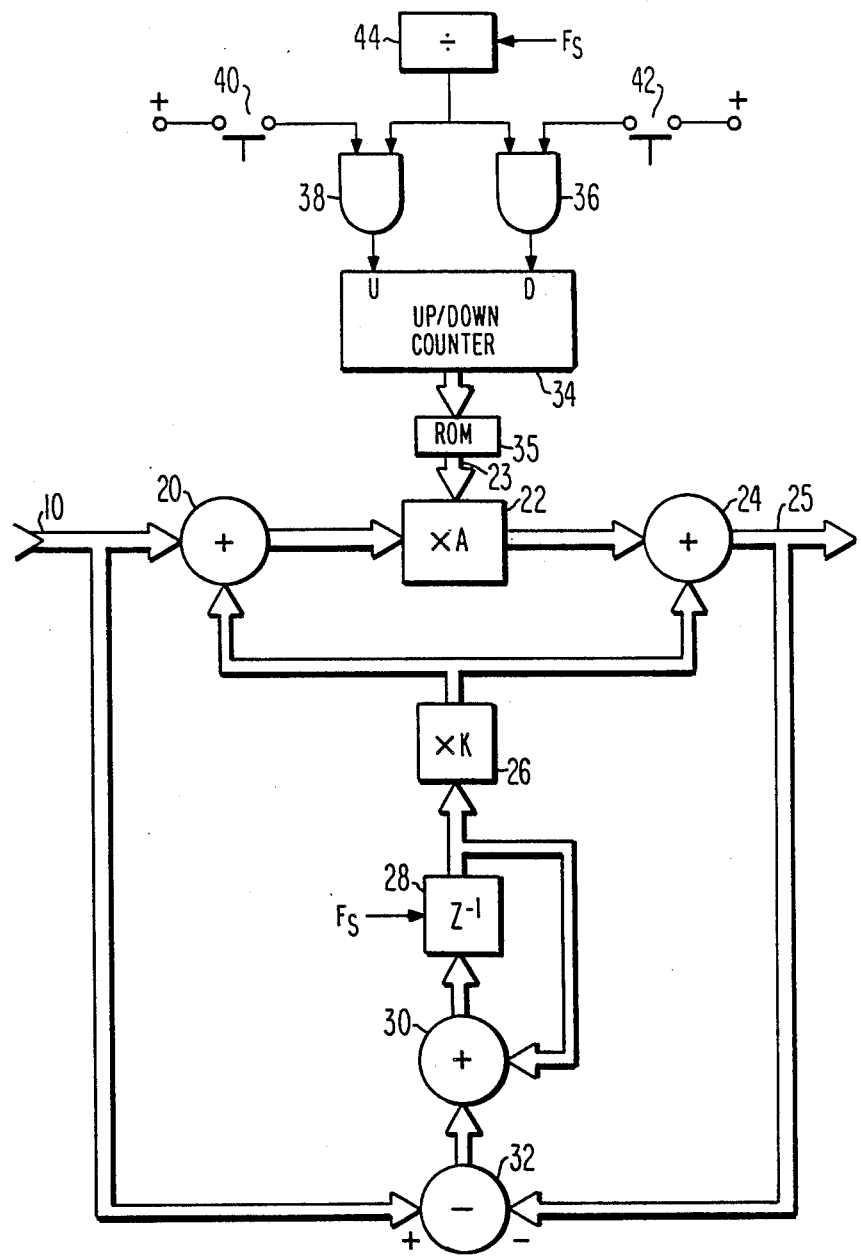
FIGS. 1 and 2 are block diagrams of tone control circuits embodying the invention.
Figure 2:
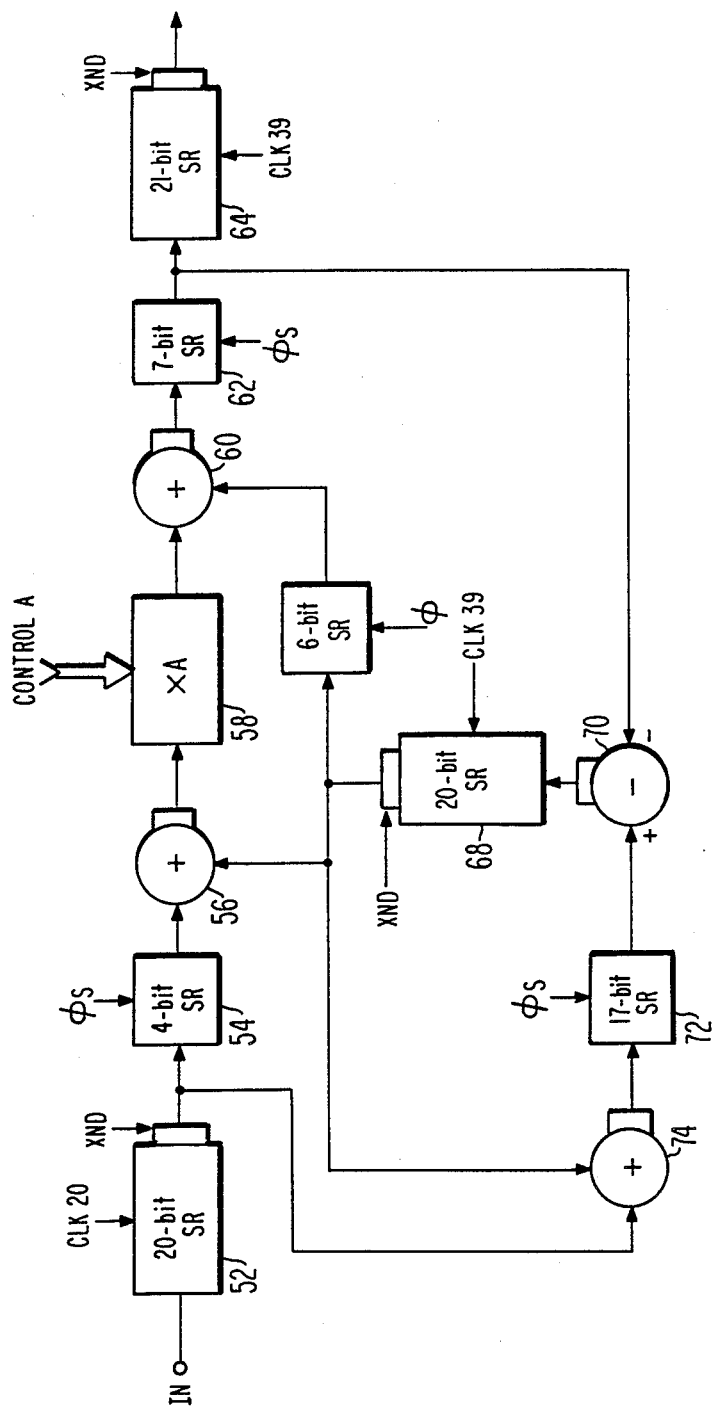

The invention will be described in terms of digital signals and digital hardware, however, it is applicable to analog sampled data systems also, using for example, charge transfer delay lines for storage elements and known summing circuitry and multipliers. In the figures, broad arrows interconnecting circuit elements represent multibit parallel connections and narrow arrows represent single conductors. The circuitry illustrated in FIG. 1 is a more generalized tone control embodiment and the circuitry illustrated in FIG. 2 is a serial-bit digital implementation. Both embodiments perform the transfer function H(Z) described by the equation $$H(Z) = [1 + (Z-1)/(1 + 1/A)K]/[1 + (Z-1)/(1+A)K] \quad (1)$$

where Z is the conventional Z-transform variable, A is a control variable and K is a scaler constant. For A equal to 1, the pole and zero of the transfer function are coincident and the response is flat. The 3 dB points, $f_p$, $f_o$, of the pole and zero for A equal to 1 is determined by the sample frequency, $f_s$, and the scaler K, and is approximated by $$f_p, f_o, \approx Kf_s/\pi; \quad K < 1. \quad (2)$$

For the value of A different than 1

$$f_p \approx f_s(1+A)K/2\pi \quad (3)$$

$$f_o \approx f_s(1+A)K/2\pi A. \quad (4)$$

Figure 4:
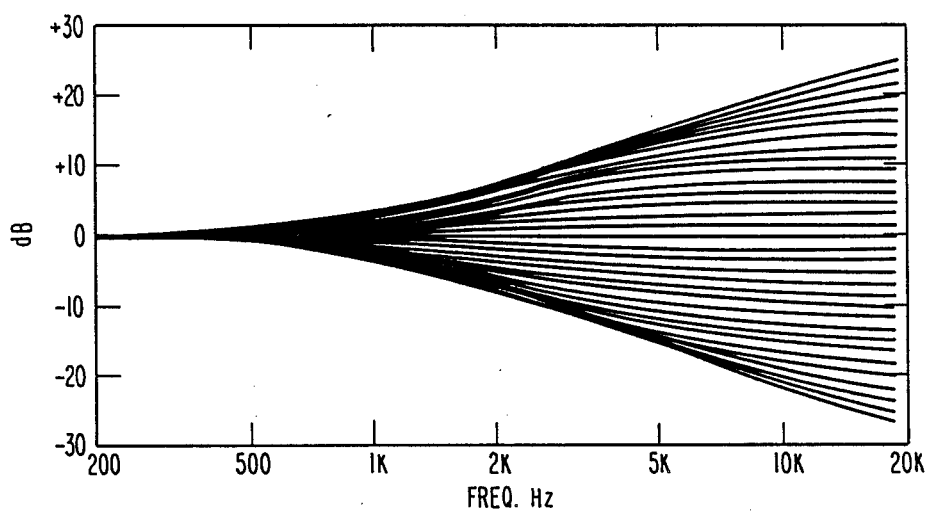
FIG. 4 is a graph of the transfer function of the circuits of FIGS. 1 and 2.

As the value of A is increased, the pole frequency increases and the zero frequency decreases and vice versa. Thus, tone control may be accomplished by varying the pole and zero positions by adjusting the control variable A. This produces the desired response curves illustrated in FIG. 4 where the respective curves in the family of response curves are determined by the control variable A. Treble boost and cut are obtained for A greater than and less than one respectively.

At high frequencies, the frequency response H(f) converges to $$H(f) = (1+A)/(1+1/A) = A; \quad K/T < f < 1/T \quad (5)$$

where T is the period of the sample rate.

Referring to FIG. 1, audio samples occurring at a rate, $f_s$, (for example 44 KHz) are applied on bus 10 and coupled to one input port of adder 20 and to the minuend input port of subtracter 32. Output sums developed by adder 20 are coupled to the signal input port of the multiplier 22. Gain control signals on bus 23 are coupled to the gain control input port of multiplier 22. The products of A times the sums are coupled to one input port of adder 24 which provides the output signal for the tone control system on bus 25.

The output signal from adder 24 is coupled to the subtrahend input of subtracter 32 which develops samples corresponding to the differences between the current input and output signals. The difference samples are coupled to a recursive filter including the series connection of adder 30 and the one sample period delay element 28, the output of which is coupled to a second input of adder 30. The filter integrates the differences according to the transfer function F(Z) given by $$F(Z) = 1/Z - 1 \quad (6)$$

The output of delay element 28 is coupled to a weighting circuit 26 which weights or scales the filtered differences by the constant factor K. Weighting element 26 may be a conventional shift-and-add multiplier. Alternatively, if the factor K is selected to have a value $2^{-N}$ (N an integer) weighting element 26 may be a hard wired bit-shifter which shifts the bits of the filtered differences to lesser significant bit positions. The weighted samples from element 26 comprise a feedback signal which is coupled to second input ports of adders 20 and 24.

The system of FIG. 1 can be shown to produce the transfer function of equation (1) as follows. Let the input and output samples be designated X and Y respectively. The output of subtracter 32 is (X−Y). The output of delay element 28 is (X−Y)/(Z−1). This value is weighted by the factor K and coupled to adder 20 which produces the sum X+K(X−Y)/(Z−1). The output of adder 20 is multiplied by A in multiplier 22 and coupled to adder 24 which produces the output Y given by $$Y = (X + K(X-Y)/(Z-1))/A + K(X-Y)/(Z-1) \quad (7)$$

or $$Y = AX + (1+A)K(X-Y)/(Z-1). \quad (8)$$

Collecting terms and solving for Y/X $$Y/X = H(Z) = [1 + (Z-1)/(1+1/A)K]/[1 + (Z-1)/(1+A)K] \quad (9)$$

which equals equation (1).

The control values A, or control signals corresponding to control values A, for developing smoothly increasing/decreasing signal boost or cut, may be generated using an up/down counter and a look-up table (ROM). In FIG. 1, the sample rate clock, $F_s$, is divided down in divider 44 to a frequency of, for example, three Hertz. This signal is coupled to the AND gates 36 and 38 which are selectively enabled responsive to closure of the switches 42 and 40 respectively. AND gates 36 and 38, when enabled, couple the clock signal to either the down-clock input, D, or the up-clock input, U, to condition the up/down counter to increment or decrement its output value. The output of the counter 34 is coupled to the address input port of the ROM 35 which is programmed to provide predetermined values for respective address input values. These values may be selected to provide either linear or logarithmic steps in the control values, A.

Due to the inherent processing delays of the system circuit elements, and depending upon the sample rate, it may be necessary to include compensating delay elements in the system. One skilled in the art of circuit design will readily recognize where such delays may be required and be able to include them.

Figure 3:
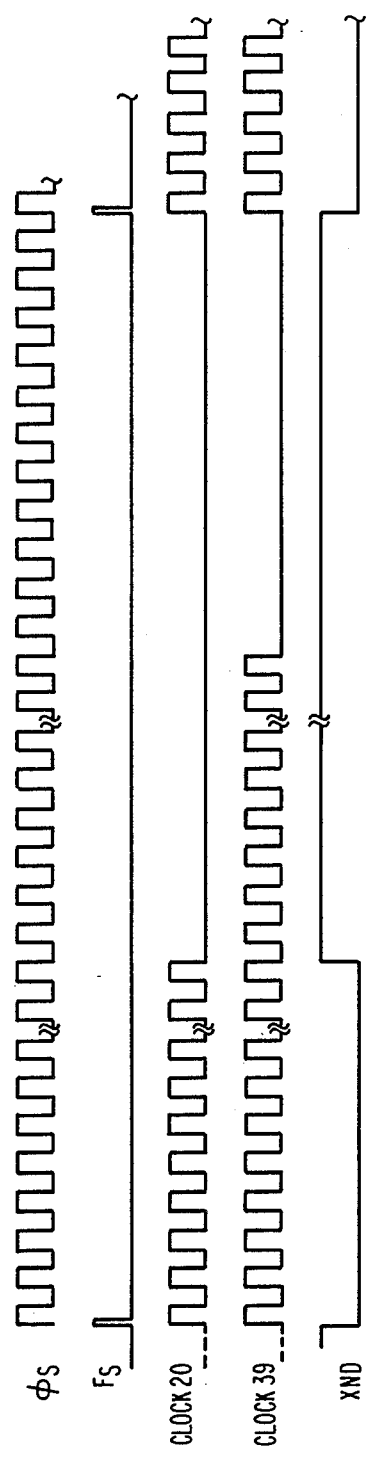
FIG. 3 is a waveform timing diagram useful in describing the embodiment illustrated in FIG. 2.

The FIG. 2 serial-bit embodiment is arranged to process two's complement binary samples which have the least significant bits, LSB's, of successive samples occurring first in time and sign bits occurring last. The samples in the example are presumed to be 20-bits wide. The system includes sign-extend shift registers, SXSR's, which include an output stage responsive to a control signal designated XND, to replicate the bit output by the register occurring immediately before the transition of the XND signal. The signal XND, illustrated in FIG. 3 is timed to capture and replicate the sign bit of each sample, from its occurrence until the end of the sample period. The sign extend function may be implemented with a transparent latch (e.g. Ser. No. 74LS373) connected in series with a conventional serial-bit shift register.

FIG. 2 includes a multiplier 58, which for illustrative purposes, may be constructed with a 74LS384 serial/parallel multiplier available from Texas Instruments Inc., Dallas, Tex. This is an (M×8) bit multiplier where M is the number of serial multiplier bits and the number 8 corresponds to eight parallel multiplicand bits. The output products are (M+8) bits wide.

In the exemplary circuitry shown in FIG. 2, the eight bit control variable applied to the parallel input port is assumed to have a binary point between the fourth and fifth bit positions so that the control variable has a range from 1/16 to 15. This provides a boost and cut range of approximately ±24 dB. Because the binary point is positioned between the fourth and fifth bits of the multiplicand, the products provided by the multiplier are effectively augmented by the factor of $2^5$ (assuming a one bit processing delay in the multiplier). To compensate for this factor, an effective delay of five bit periods is attributed to the multiplier.

In addition, the circuit includes adders and subtracters each of which are presumed to have an inherent processing delay of one sample bit period.

Finally, the FIG. 2 embodiment does not contain an explicit weighting element for weighting the difference samples by the factor K. However, serial-bit samples may be weighted by factors of $2^N$ by delaying or advancing the serial-bit samples by integral numbers of bit delays which effectively shifts the sample bits to positions of greater or lesser significance respectively. Weighting by the factor K is accomplished in this manner in the system of FIG. 2.

Referring to FIGS. 2 and 3, samples to be processed are applied to the terminal designated IN at a sample rate defined by the signal designated $F_s$ and a sample bit rate defined by the system clock $\phi_s$ shown in FIG. 3. The 20-bit samples are loaded into the SXSR 52 responsive to CLOCK 20 which contains bursts of twenty pulses of the $\phi_s$ rate clock. At the beginning of a sample period, the sample currently stored in SXSR is clocked out of the register and coupled to adder 74 and a compensating delay register 54 which delays the sample by four bit periods. The output of delay register 54 is coupled to one input terminal of adder 56. The output of SXSR 68 (which corresponds to delay element 28 in FIG. 1) is coupled to a second input terminal of adder 56. Because of the imposition of delay register 54, samples from SXSR 68 arrive at adder 56 4-bit periods in advance of samples from SXSR 52. This effects a scaling of the samples from SXSR 68 by $2^{-4}$ or 1/16 relative to samples from SXSR 52 and corresponds to weighting the samples from SXSR 68 by the factor K.

Sample sums from adder 56 are coupled to the serial input terminal of the serial/parallel multiplier 58 which multiplies these samples by the control variable A. The products developed by multiplier 58 are coupled to adder 60, the output of which is coupled to a compensating delay register 62 which delays the products by seven sample bit periods.

The output of delay register 62 is coupled to the subtrahend input terminal of subtracter 70. The minuend input of subtracter 70 is coupled to the output of adder 74 via compensating delay register 72 which provides a delay of 17 sample bit periods. Register 72 is included to equalize delays in both of the signal paths (elements 74, 72 and elements 54, 56, 58, 60, 62) from SXSR 52 to the respective input terminals of subtracter 70 so that the binary points of both the subtrahend and minuend applied to subtracter 70 are aligned.

The output of subtracter 70 is coupled to the input of SXSR 68 which provides a delay of one sample period to the differences provided by subtracter 70. The output of SXSR 68 is couped to a second input of adder 74. If the output samples from SXSR 52 and delay register 62 are designated X and Y respectively, the output of SXSR 68 can be shown to be (X−Y)/(Z−1) which is equivalent to the output of delay element 28 in FIG. 1, even though the adder 74 and subtracter 70 in FIG. 2 are sliqhtly rearranged from the corresponding adder 30 and subtracter 32 in FIG. 1.

The output of SXSR 68 is coupled to a seoond input terminal of adder 60 through a compensating delay register 66 which provides a delay of six sample bit periods.

The delay provided by register 66 is made equal to the effective delay between the input terminals of adder 56 and the input terminals of adder 60 (elements 56 and 58) so that the samples applied to adder 56 and adder 60 from SXSR 68 are scaled by the same factor. Adder 56 contributes a delay of one sample bit period and multiplier 58 contributes an effective delay of five sample bit periods for a total of six sample bit periods which equals the delay assigned to register 66. The system of FIG. 2 with registers 54 and 66 providing delays of four and six sample bit periods is a serial-bit equivalent to the system of FIG. 1 for a weighting factor K equal to 1/16.

In order to properly align or justify the output samples with respect to input sample timing, the samples from delay register 62 are applied to SXSR 64 which includes 21 stages. SXSR 64 is clocked by CLOCK 39 (FIG. 3) having brusts of 39 pulses of the clock $100_s$. At the end of the sample period, the processed sample from SXSR 52 should be loaded in the 20 LSB positions of SXSR 64. Counting the processing delays of the MSB in SXSR 52 there are 20 bit-delays in SXSR 52, 4 bit-delays in register 54, 1 bit-delay in adder 56, 5 bit-delays in multiplier 58, 1 bit-delay in adder 60, 7 bit-delays in register 62 and 1 bit-delay in SXSR 64 for a total of 39 bit-delays. Thus, SXSR 64 must be clocked for a total of 39-bit periods. Note that the processed samples from adder 60 may in fact be 29-bits wide, however, the LSB's are essentially dumped off the end of SXSR 64 by virtue of SXSR 64 being a sign extend register.

SXSR 68 is clocked with bursts of 39 pulses (CLOCK 39) for the same reason that SXSR 64 is clocked with 39 pulses. The timing relationship of CLOCK 20 and CLOCK 39 is illustrated in FIG. 3.

What is claimed:

1. A sampled data tone controlled system comprising:
a system input terminal for applying input samples, and an output terminal at whioh output samples are available;
means for applying a control variable A;
means coupled to said system input terminal and said output terminal for subtractively combining said input and output samples and integrating the combined samples to produce feedback samples; and
means, coupled to said system input terminal, said means for providing feedback samples and said means for applying a control variable A, for combining said input samples and said feedback samples in the ratio A:1+A to produce said output samples.

2. A sampled data tone control system comprising:
an input terminal and an output terminal;
a cascade connection of a first signal summing means, a multiplier element, and a second signal summing means coupled between said input and output terminals in the recited order, and wherein said multiplier element includes a control input terminal for applying tone control signals;
subtractive signal combining means coupled between said input and output terminals for producing signal differences; and
filter means having an input coupled to said subtractive signal combining means and an output coupled to said first and second signal summing means.

3. The system set forth in claim 2 wherein said filter means is an infinite impulse response type filter.

4. The system set forth in claim 2 wherein said filter means comprises:
further summing means having a first input terminal coupled to said subtractive signal combining means, having a second input terminal and an output terminal; and
a delay element having input and output terminals coupled to the output and second input terminals respectively of said further summing means.

5. The system set forth in claim 4 wherein said filter means further comprises means for weighting signals produced from said delay element.

6. The system set forth in claim 5 wherein said system processes digital signal samples and said means for weighting comprises means for changing the bit significance of digital signal samples.

7. A sampled data signal treble control system comprising:
a system input terminal for applying input signal and a system output terminal;
means coupled to said system input and system output terminals including means for subtractively combining said input and output signals and processing the combined signals according to the transfer function $1/(Z-1)$ to produce a feedback signal, where Z is the conventional Z-transform variable;
means for additively combining said input signal and said feedback signal;
means for multiplying the additively combined input signal and feedback signal by a control variable; and
means for additively combining signal from said means for multiplying and said feedback signal to produce a treble controlled output signal at said system output terminal.

8. The system set forth in claim 7 wherein the means producing a feedback signal includes means for weighting the signal processed by the transfer function, by a constant.

9. The system set forth in claim 7 wherein the means producing the feedback signal includes:
a subtracter having an output terminal, and having minuend and subtrahend input terminals respectively coupled to said system input and system output terminals;
a one sample period delay element having input and output terminals; and
an adder having first and second input terminals coupled to the output terminals of the subtracter and delay element respectively, and having an output terminal coupled to the input terminal of said delay element.

10. The system set forth in claim 9 wherein the means producing a feedback signal further includes means for weighting signal output by said delay element.

11. The system set forth in claim 10 wherein said system processes digital samples and said means for weighting signal comprises means for changing the bit significance of digital signal samples.

12. A sampled data treble control system comprising:
a system input terminal for applying a sampled data signal;
a system output terminal;
means for applying a control signal;
first and second summing means having respective first and second input terminals and respective output terminals;
a multiplier circuit having a control terminal coupled to said means for applying a control signal, and having a signal input terminal coupled to the output terminal of the first summing means and having an output terminal coupled to the first input terminal of the second summing means;

means for coupling the system input terminal to the first input terminal of the first summing means;

means for coupling the output terminal of the second summing means to the system output terminal;

means coupled to the system input terminal and the output terminal of the second summing means for integrating differences between signals applied to the system input terminal and the output terminal of the second summing means; and means for coupling the integrated differences to the respective second input terminals of the first and second summing means.

13. The system set forth in claim 12 wherein the means for coupling the integrated differences to the first and second summing means includes weighting means for scaling the integrated differences by a constant.

14. The system set forth in claim 12 wherein the means for integrating differences includes:
a subtracter having minuend and subtrahend input terminals coupled to said system input terminal and said second summing means output terminal respectively, and having an output terminal;
a further summing means having a first input terminal coupled to the output terminal of said subtracter, having a second input terminal and an output terminal; and
a one sample period delay element having input and output terminals respectively coupled to the output and second input terminals of said further summing means.

15. The system set forth in claim 12 wherein the means for integrating differences includes:
a one-sample period delay element having input and output terminals;
a further summing means having first and second input terminals coupled respectively to said system input terminal and the output terminal of the one-sample period delay element, and having an output terminal; and
a subtracter having minuend and subtrahend input terminals respectively coupled to the output terminals of the further and second summing means, and having an output terminal coupled to the input terminal of the one-sample period delay element.

* * * * *